(12) United States Patent
van den Berghe (10) Patent No.: US 11,924,050 B2
(45) Date of Patent: Mar. 5, 2024

(54) METHOD AND SYSTEM FOR PREDICTING THE EVOLUTION OF SIMULATION RESULTS FOR AN INTERNET OF THINGS NETWORK

(71) Applicant: FUJITSU LIMITED, Kawasaki (JP)

(72) Inventor: Sven van den Berghe, Marlow (GB)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/474,803

(22) Filed: Sep. 14, 2021

(65) Prior Publication Data
US 2022/0124001 A1    Apr. 21, 2022

(30) Foreign Application Priority Data

Oct. 15, 2020 (EP) .................................. 20202133

(51) Int. Cl.
*G06F 15/16* (2006.01)
*H04L 41/14* (2022.01)
*H04L 41/147* (2022.01)

(52) U.S. Cl.
CPC .......... *H04L 41/145* (2013.01); *H04L 41/147* (2013.01)

(58) Field of Classification Search
CPC ..................... H04L 41/145; H04L 41/147
USPC ........................................................ 709/224
See application file for complete search history.

(56) References Cited

U.S. PATENT DOCUMENTS

| 5,490,272 A | * | 2/1996 | Mathis | ................. G06F 9/4843 712/E9.032 |
| 2018/0054376 A1 | | 2/2018 | Hershey | |
| 2018/0210436 A1 | | 7/2018 | Burd | |
| 2020/0285855 A1 | * | 9/2020 | Brebner | ................. G06V 10/96 |

FOREIGN PATENT DOCUMENTS

| WO | WO 2018/132112 A1 | 7/2018 |
| WO | WO 2019/180433 A1 | 9/2019 |

OTHER PUBLICATIONS

Extended European Search Report dated Mar. 31, 2021 in corresponding European Patent Application No. 20202133.3 (7 pages).

(Continued)

*Primary Examiner* — Suraj M Joshi
*Assistant Examiner* — Joel Mesa
(74) *Attorney, Agent, or Firm* — STAAS & HALSEY LLP (57) ABSTRACT

A method of predicting the evolution of simulation results for an Internet of Things (IoT) network by creating a source digital twin for the IoT network, driven by real-time sensed data from objects fed to models of the objects interconnected as object nodes in a directed acyclic graph (DAG) with the interconnections representing flow of data, the source digital twin outputting a state of one or more of the objects in real time; creating a clone digital twin of the source digital twin; connecting input of the clone digital twin with output of the source digital twin via a data stream synthesizer node, the data stream synthesizer node adds a time increment to the output of the source digital twin to drive the clone digital twin at the incremented time. The source digital twin and the clone digital twin are executed to indicate an evolved state of one or more of the objects at the incremented time as the output of the clone digital twin.

15 Claims, 9 Drawing Sheets

(56) References Cited

OTHER PUBLICATIONS

Adil Rasheed et al.; "Digital Twin: Values, Challenges and Enablers From a Modeling Perspective"; IEEE Access; published Jan. 28, 2020; (33 pages).

Arun Joseph et al.; "Predictive Mitigation of Short Term Voltage Instability Using a Faster Than Real-Time Digital Replica"; 978-1-5386-4505-5/18, 2018 IEEE; (6 pages).

David Jones et al; "Characterising the Digital Twin: A systematic literature review"; CIRP Journal of Manufacturing Science and Technology, vol. 29, Part A, May 2020, pp. 36-52; (52 pages).

\* cited by examiner

METHOD AND SYSTEM FOR PREDICTING THE EVOLUTION OF SIMULATION RESULTS FOR AN INTERNET OF THINGS NETWORK

CROSS-REFERENCE TO RELATED APPLICATIONS

This application is based on and hereby claims priority under 35 USC 119 to European Patent Application No. 20202133.3, filed on Oct. 15, 2020, in the European Patent Office, the entire contents of which is incorporated herein by reference.

FIELD

The present invention relates to simulation (modelling) of a network of objects in the Internet of Things (IoT). The IoT refers to the interconnection via the Internet (and potentially other networks) of computing devices embedded in everyday objects, enabling them to send and receive data. The present application uses the concept of digital twins (DTs), which are virtual (mathematical) models that reflect the current state of an object being modelled, using data input to its counterpart object. The digital twin is updated and changes as the counterpart object is updated and changes, for example to reflect a new state (variable result of the inputs, describing the status), such as a working condition and/or position.

BACKGROUND

One example of the use of digital twins is in managing transport such as in smart cities, but there are other many applications, for example in power networks, to ensure a balanced supply of power across a wide area.

Taking the example of transport, smart traffic systems (or Intelligent Transportation Systems (ITS)) used to regulate traffic by linking data from sensors and traffic signals have the promise to make transport better (more reliable, more efficient, safer, faster) by optimising the operation of the whole system including roads, road-side infrastructure, vehicles, pedestrians etc. These systems combine data generated by the sensors (in suitable positions in the system such as in vehicles, on travellers, and in the infrastructure) and data from other sources (for example weather data and/or social data) using big data technologies and Machine Learning (ML).

SUMMARY

To deliver the promise of better transport, smart traffic systems have to deliver a wide range of services to diverse users at scale (there may be thousands or more users) and in real time (fast enough to take effective action).

The requirement is to deliver a wide range of services created by complex processing of, primarily, real-time sensed data streaming from sources on or serving a transport network, e.g. roads, vehicles. The responses of the services need to be created in "real time" that is fast enough for immediate action to be taken by the users of the services. There are diverse data sources, generating different types of data at different rates. The services are also diverse and complex, using the data in a wide range of different ways.

For example, a transport authority for a large city can create a system digital twin of its public transport infrastructure that provides a real-time virtual model of the flow of people throughout the city. The virtual model is driven by data generated from a wide variety of sources in real time:
  Vehicle movements from in-vehicle GPS, road-side sensors, CCTV analysis, routing requests, live dispatches of public transport
  State and operation of infrastructure such as traffic lights
  Movement of people, from mobile GPS, ticketing activity, CCTV.

The National Traffic Information Service, responsible for managing traffic on England's trunk road network, acquires data from about 1,000,000 vehicles travelling on the network, 1,000 number plate cameras and over 10,000 road-side monitoring units. Transport of London, responsible for the public transport system and the road network of London, operates over 9,000 buses and 900 trains, controls 6,300 traffic signals, manages traffic for vehicles travelling over 100,000,000 km per day, and over 5,000,000 public transport passenger movements per day.

System digital twins (virtual models of the system) integrate these data sources and provide real-time understanding of the state of traffic flow. Synchronous services can be added to the digital twin such as using anomaly detection methods to determine incidents (accidents, congestion etc.). However, there is also the need to manage these incidents, for example to divert traffic around accidents, deploy emergency services and/or reroute public transport. System digital twins can aid this if they have a predictive capability, to move the virtual state of the model forward in time (faster than real time, or at a constant offset from real time).

In other words, a requirement of smart transport systems is to predict the state of the system and so enable services such as detecting collisions, accurate trip time forecasts, establishing the impact of incidents on the system, indicating when public transport will arrive, selecting individual taxis etc. Each of these services is directly or indirectly based on the state of the modelled infrastructure/objects within the infrastructure, in terms primarily of positioning.

The same requirement is evident in other application areas, for example power networks.

According to an embodiment of a first aspect of the invention, there is provided a method of predicting the evolution of simulation results for an Internet of Things, IoT, network, comprising: creating a source digital twin for the IoT network, driven by real-time sensed data from objects fed to models of the objects which are interconnected as object nodes in a directed acyclic graph, DAG, with the interconnections representing the flow of data, the source digital twin outputting a state of one or more of the objects in real time; creating a clone digital twin, which includes the same models and interconnections as the source digital twin; connecting the input of the clone digital twin with the output of the source digital twin via a data stream synthesizer node, wherein the data stream synthesizer node adds a time increment to the output of the source digital twin so that the source digital twin drives the clone digital twin at the incremented time; and executing the source digital twin and the clone digital twin to provide the evolved state of one or more of the objects at the incremented time as the output of the clone digital twin.

Each digital twin in this sense is a system digital twin, and the individual models (nodes) are object digital twins.

The data stream synthesizer emulates the input of real-time data to the source digital twin at the clone digital twin, using the output of the source digital twin and provides time-incremented synthesized values (for example by incrementing a position using the output position and speed of a vehicle from the source digital twin and determining the position at a selected time). Thus, instead of a real-life detected position, a synthesized position for a predetermined time increment is provided to the clone based on known data.

This allows the clone digital twin (which has the same modelling as the source digital twin, and for example starts with the same state as the source digital twin) to then produce an evolved state, which is a future predicted state. More than one clone digital twin may be provided in a sequence (after a single source digital twin), as explained in more detail hereinafter, to extrapolate into the future.

In order to allow the preferred type of calculation platform to function (or function efficiently), the source digital, clone digital twin and data stream synthesizer node (in fact all the nodes in the simulation system which is constructed, including any series of clone digital twins) together form an overall DAG.

Nodes in the simulation are not limited to nodes representing objects. Depending on the circumstances any suitable types of nodes may be added. Nodes in the source digital twin (and thus in the clone digital twin(s)) may also include event nodes modelling events which affect the IoT network, such as incidents which have an impact on the state of the objects.

Additionally or alternatively, nodes in the source digital twin (and thus in the clone digital twin(s)) may also include system information nodes modelling information about the IoT network (such as a bus route).

The method may further comprise further comprising creating a service node (as part of the overall DAG) at the output of the source digital twin or at the output of the clone digital twin or both. The service node may, for example, produce a data service based on the state of an object in the IoT network. More preferably, the output and the service are both based on the state of all the nodes in the network, whether in real time (at the output of the source) or in the future (at the output of any clone digital twin(s)). Of course, the service can use the state of more than one object, or even other services and the predicted evolved state of objects in chains of clones.

Such "services" may be viewed as functions (in the mathematical sense) of the states. For example, the predicted position of a vehicle is a state, but the system can output warnings of collisions, which is a service/function which depends on the positions (part of the state) of all the vehicles.

In a preferred construction, the service node is provided in parallel with the data stream synthesizer at the digital twin. In this arrangement, the method may further comprise feeding the same output to both nodes. It will be appreciated, that no data synthesizer is required at the output of the last digital clone in a sequence.

In more detail, if there is more than one clone digital twin in a digital twin sequence, the method may further comprise creating a further (or second) clone digital twin, which includes the same models and interconnections as the source digital twin and the clone digital twin; and connecting the input of the further clone digital twin with the output of the clone digital twin via an additional data stream synthesizer node, wherein the additional data stream synthesizer adds a further time increment to the output of the clone digital twin so that the clone digital twin drives the further clone digital twin at the further incremented time and executing the source digital twin, the clone digital twin and the further clone digital twin, to provide data at the output of the further clone digital twin indicating the state of one or more of the objects at the further incremented time.

The further digital twin may start using the same state as the first digital twin, but then the state will be changed by the time increment. If there are more than two clone digital twins, each one may be connected as set out above with a further clone digital twin connect to a previous digital twin.

The time increment for each clone digital twin may have a different value. Preferably each subsequent time increment has a larger value.

Input into the simulation is not limited to real-time sensor data or IoT data. Preferably, context information from an external data source is additionally input into the source digital twin and/or into the clone digital twin(s).

Turning to a preferred specific application, the IoT network may be a traffic network. Here, the object nodes may include vehicle nodes and/or one or more infrastructure nodes. One or more event nodes are included, such as a traffic incident node.

The state of one or more of the objects may include one or more of: position of the object and speed of the object.

In one scenario, the traffic network is a public transport network, and the nodes in the source digital twin and clone digital twin(s) include vehicle nodes, incident nodes representing events that can have an effect on the public transport network, stop nodes representing a section of the public transport network infrastructure, and system information nodes representing the path of the vehicle. In this case, the order of the DAG may be Incident, Stop, Run and then Bus nodes (with the nodes of each type being in parallel in each digital twin of the system).

According to an embodiment of a second aspect of the invention, there is provided a computer program comprising instructions which, when the program is executed by a computer, cause the computer to carry out any of the methods as described above.

The program may execute locally or on the cloud or both to provide the computer-implemented method at a local device. For example, the digital twins may be built and executed at a server (on the cloud) and the outputs may be provided to a local device to give a specific service.

According to an embodiment of a third aspect of the invention, there is provided a computer (data processing apparatus) comprising a processor and memory and a network interface configured to carry out the method of any of the preceding claims. The processor and memory may be linked to a display (for example displaying the DTS/service or results) and/or to an input device (for a developer to build or input data and parameters to build the models, or for the end user to interact with the service).

A corresponding computer system may comprise the computer as defined above, a display, and an input device and any other required components.

An apparatus (computer or computer system) or computer program according to preferred embodiments of the present invention may comprise any combination of the method aspects. Methods or computer programs according to further embodiments may be described as computer-implemented in that they require processing and memory capability.

The apparatus according to preferred embodiments may be described as configured or arranged to, or simply "to" carry out certain functions. This configuration or arrangement could be by use of hardware or middleware or any other suitable system. In preferred embodiments, the configuration or arrangement is by software.

The invention may be implemented in digital electronic circuitry, or in computer hardware, firmware, software, or in combinations of them. The invention may be implemented as a computer program or computer program product, i.e., a computer program with instructions tangibly embodied in a non-transitory information carrier, e.g., in a machine-readable storage device, or in a propagated signal, for execution by, or to control the operation of, one or more hardware modules.

A computer program may be in the form of a stand-alone program, a computer program portion or more than one computer program and may be written in any form of programming language, including compiled or interpreted languages, and it may be deployed in any form, including as a stand-alone program or as a module, component, subroutine, or other unit suitable for use in a data processing environment. A computer program may be deployed to be executed on one module or on multiple modules at one site or distributed across multiple sites and interconnected by a communication network.

Method steps of the invention may be performed by one or more programmable processors executing a computer program to perform functions of the invention by operating on input data and generating output. Apparatus of the invention may be implemented as programmed hardware or as special purpose logic circuitry, including e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random-access memory or both. The essential elements of a computer are a processor for executing instructions coupled to one or more memory devices for storing instructions and data.

The invention is described in terms of particular embodiments. Other embodiments are within the scope of the following claims. For example, the steps of the invention may be performed in a different order and still achieve desirable results. Multiple test script versions may be edited and invoked as a unit without using object-oriented programming technology; for example, the elements of a script object may be organized in a structured database or a file system, and the operations described as being performed by the script object may be performed by a test control program.

Elements of the invention may be described using the terms "processor", "input device" etc. The skilled person will appreciate that such functional terms and their equivalents may refer to parts of the system that are spatially separate but combine to serve the function defined. Equally, the same physical parts of the system may provide two or more of the functions defined.

For example, any separately defined means may be implemented using the same memory and/or processor as appropriate.

BRIEF DESCRIPTION OF THE DRAWINGS

Preferred features of the present invention will now be described, purely by way of example, with references to the accompanying drawings, in which.

DETAILED DESCRIPTION

Processing of streaming data at scale and delivering insights in real time is used in many web-scale applications such as processing click streams to deliver advertisements, in online fraud detection and in video media consumption. There are also applications in smart transport by, for example, ride hailing services where location data are used to deliver arrival estimates, pricing, driver allocation and ride monitoring. The latter applications commonly require merging of more than one data stream, for example to match a passenger with a driver and vehicle. However, the design of stream data processing systems makes this difficult. Complex processing can only be applied at the level of a single data stream and merging different data streams requires a lot of effort. This is a particular problem if the processing depends on the history of an object, as there is no mechanism in the prior art to retain the correlated history of multiple data streams. This limits the number and the sophistication of the services that can be built on the real-time data stream. As a result, real-time services are often simplistic, with more complex processing performed off-line.

One useful concept used to develop more sophisticated services is the digital twin, introduced above, where actual entities in the real world, such as vehicles, are replicated in the digital realm with their behaviour modelled in code but driven by values from the incoming stream of sensor data. One advantage of digital twins is that they separate the services from operating directly on the data stream; services can operate on the state and output of the digital twins.

When modelling complex systems, designers distinguish between the digital twin of the whole system (System digital twin, e.g. smart cities) and digital twins of the components (Object digital twins, e.g. vehicles, passengers, traffic lights). Object digital twins automatically handle the gathering of all the data streams that relate to their real world counterpart (for example, vehicle telemetry and location data from the current occupants), can store all relevant history (states), and perform complex processing to model the behaviour or state of the object, which is then the output.

Such digital twins can be built on large scale, high volume streaming data using platforms such as Fujitsu's Stream Data Utiliser (aka Dracena: <URL: https://www.fujitsu.com/global/about/resources/news/press-releases/2019/1008-01.html>), Flink's Stateful Functions (<URL: https://flink.apache.org/stateful-functions.html>) or Azure's Durable Functions (<URL: http://docs.microsoft.com/en-us-azure/azure-functions/durable/durable-functions-overview?tabs=csharp>).

Platforms that process streaming data achieve high performance partly by restricting the types of computation that can be performed with a common constraint requiring that the processing be structured as a Directed Acyclic Graph (DAG). A processing graph consists of nodes (which correspond to Object digital twins or services using their output), where computation occurs, and edges that connect the nodes and represent the flow of data or events. If a graph is a DAG, then the events always flow in a forward direction. Hence there are no cycles that allow the reprocessing of data already processed by a node. In other words, the nodes can be grouped into sets forming stages and there can be no communication from one stage to a previous stage or "backwards"/"sideways" between nodes in a stage.

Some platforms, such as Flink's Stateful Functions, may allow such cycles in processing, but at a significant penalty in performance.

There are techniques to overcome these limitations, such as introducing nodes that aggregate events or by splitting the digital twin over several stages.

Digital twins implemented using these technologies are able to provide services based on the current or recent past states but have difficulties when asked to deliver services that require predictions of the evolution of the states into the future. In the prior art, time dependency would be incorporated into a system digital twin by modifying the behavioural equations of each individual object twin. The time dependency of the interaction between the object twins would then require messages to be passed between object twins (nodes) that share the same computational stage. As discussed above, with streaming platforms requiring computations constructed as a DAG this becomes impossible.

Figure 1:
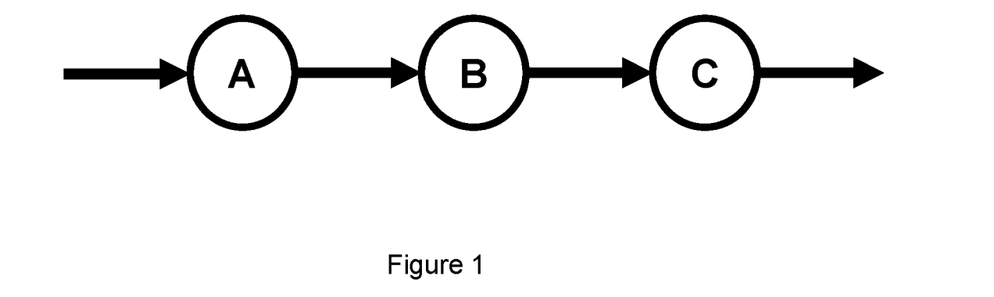
FIG. 1 is a schematic representation of a simple processing DAG.

FIG. 1 shows a very simple processing DAG. The lettered circles (A, B, C) are processing nodes, the connecting edges represent the flow of data (arrows indicate direction). This DAG could be used to predict travel times along a section of road in which case Node A would be an Object digital twin of a vehicle, and Node B an Object digital twin of a section of road. Node C provides a travel time estimation service. In practice there would be many instances of type Node A and Node B and a few instances of Node C, but the flow of data would be strictly left to right. Nodes A feed vehicles' position(s) and route(s) to Nodes B, which accumulate the data to compute the traffic density on their segment. Nodes C use the traffic density to compute travel times.

Figure 2:
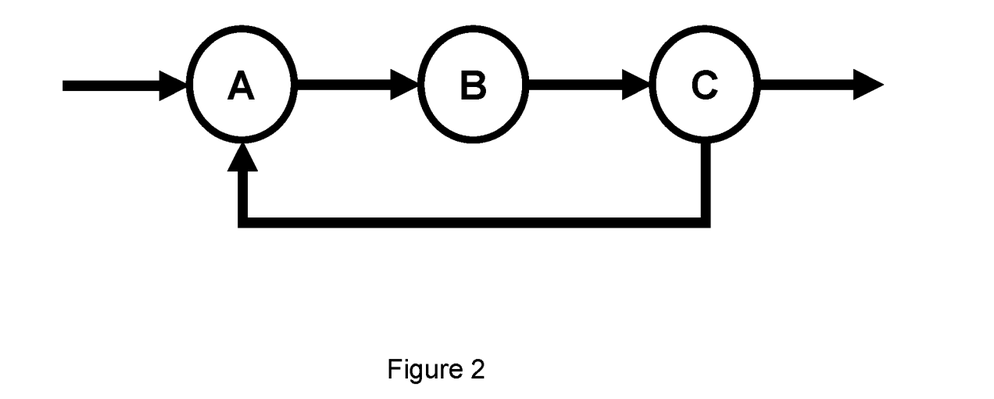
FIG. 2 is a schematic representation of a simple processing DAG with data flow for predictive capability.

The configuration in FIG. 1 provides a view of the current travel times but does not provide a view of the future state of the roads. An estimate of where the vehicles will be at the future time depends on the travel time over the road segments, which is calculated at Node C. FIG. 2 shows the data flow that is required to achieve this. The movement of data from Node C to Node A means that the graph is no longer a DAG and cannot be processed (or cannot be processed efficiently) using current stream data processing systems.

Arrangements herein allow the estimation of the future state of a system modelled by a digital twin by replicating the digital twin to create a clone digital twin which has the same mathematical modelling as in the original (or source) digital twin, but different inputs and thus different outputs. Hence the modelling is the same, but the state of the twin will be different (due to the ML learning and/or difference in time).

As used herein, a source digital twin (sDT) is the virtual model of a physical object or system (for example, a System digital twin such as of a smart city, transport network, power network etc.) that reflects the current state of the physical system/object and is driven by events and sensor readings from the real world.

As used herein, a clone digital twin (cDT) is a virtual model of a physical object or system that reflects the state of the physical system at some time in the future with possibly some actions performed on it. cDTs are driven by the output of one or more other DTs in the collection.

As used herein, the term "driven" defines the main source of data that is used to set the state, and so the modelled behaviour, of a digital twin. In conventional digital twins this is the real world, but in this methodology digital twins can be driven by the output of other digital twins.

As used herein, a digital twin Collection is a set of one or more digital twins (usually System digital twins).

As used herein, a Physical System or Object is some part of the real world that is modelled by a digital twin as described in this document.

As used herein, a digital twin sequence (DTS) is an ordered collection of System digital twins offset from each other by some time interval (not necessarily constant) and intended to model the evolution of the Physical System into the future. The sequence starts with an sDT and is followed by a number of cDTs, each cDT is driven by the previous DT in the sequence. DTSs execute at real time so DTs in the sequence always reflect the state of the Physical System at the same offset from current time.

As will be explained hereinafter in more detail, executing these clones concurrently with the original digital twin but with their system time (modelled time) advanced by short increments allows estimation of a future state. A series of clones may run concurrently, advancing time by increments until the desired prediction offset is reached, or a single clone may be provided.

Figure 3:
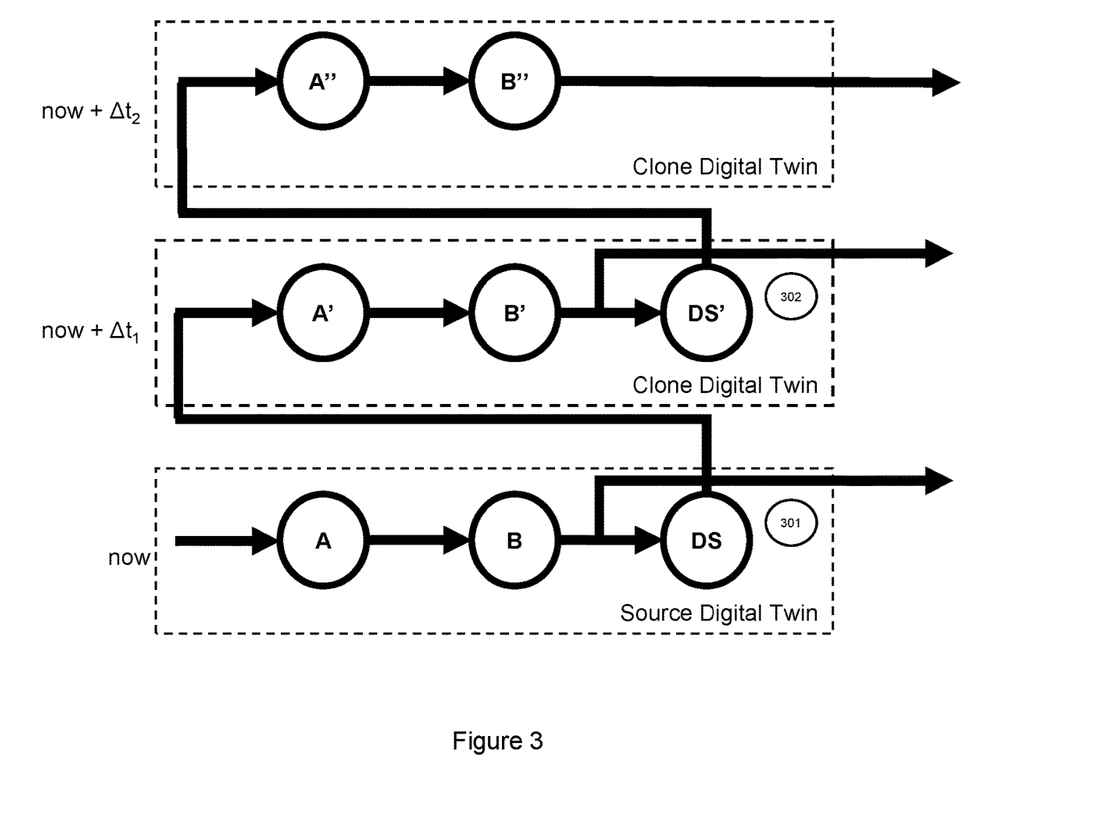
FIG. 3 is a schematic representation of a source digital twin and two clone digital twins.

FIG. 3 is a schematic diagram of nodes and data flow which shows the new flow of data and structure of computation. It should be observed that the data flow is strictly unidirectional (left to right) through the graph, maintaining it as a DAG. The System source digital twin (with Object twins A and B) is shown in the lowest layer. The future states of the system are shown as the higher layers, each of these also maintain a DAG. These future states are provided by clone digital twins cDTs at time now+$\Delta t_1$ (with Object twins A' and B') and now+$\Delta t_2$ (with Object twins A" and B") in this diagram, where $\Delta t_n$ is the offset from real time—now—of the cDT. Here, now+$\Delta t_2$ can be viewed as the first clone time plus further time increment. All the digital twins export the same data/services as previously (data exiting to the right). Of course, more clone digital twins may be provided, or a single clone digital twin may be provided.

FIG. 3 introduces a new type of processing node, a "Data Stream Synthesiser"-labelled DS (301, 302), which effectively provides a modified "synthetic" data stream for the following cDT and is responsible for advancing the simulation time. The Data Stream Synthesiser takes the state of all of the Object twins in the System twin (sDT or cDT) and implements services that model the time evolution of each twin to advance simulation time to the time of the following clone. For example, the data stream synthesizer will use speed and position data of a vehicle to advance the position of the vehicle to an estimated position at the incremented time. Other examples are: using traffic signal sequencing to determine the light setting of a traffic signal at the incremented time; using a number of embarkations/disembarkations of passengers to determine if a bus will have left a stop at the incremented time; or using downstream traffic density and flow to calculate the density of traffic upstream at the incremented time. Any or all of these examples and other suitable algorithms may be used in combination, depending on the data available, the accuracy required and the computing power available. In a power generation and distribution scenario, one example of time evolution modelling is using weather forecast (context) data to set the amount of power being generated at the incremented time.

The Data Stream Synthesiser uses its time-advanced state to produce predictions of the data that the real-world sensors would produce at the simulation time of the next clone.

Using this construction, the input future clones can be the output of the previous clone in the sequence. The "now" digital twin is driven by external events and data (entering from the left), but the future clone digital twins (at time now+$t_1$ and now+$t_2$) are driven by the synthesised results of the previous digital twin ("now" drives now+$\Delta t_1$, now+$\Delta t_1$ drives now+$\Delta t_2$ etc.).

The services are not shown here (or in FIG. 4), but may be a Node B, so that there is a single Object digital twin, or may be provided as an extra node for each digital twin (or any digital twin that provides the service), for example in series before the data stream synthesizer or in parallel with the data stream synthesizer.

Figure 4:
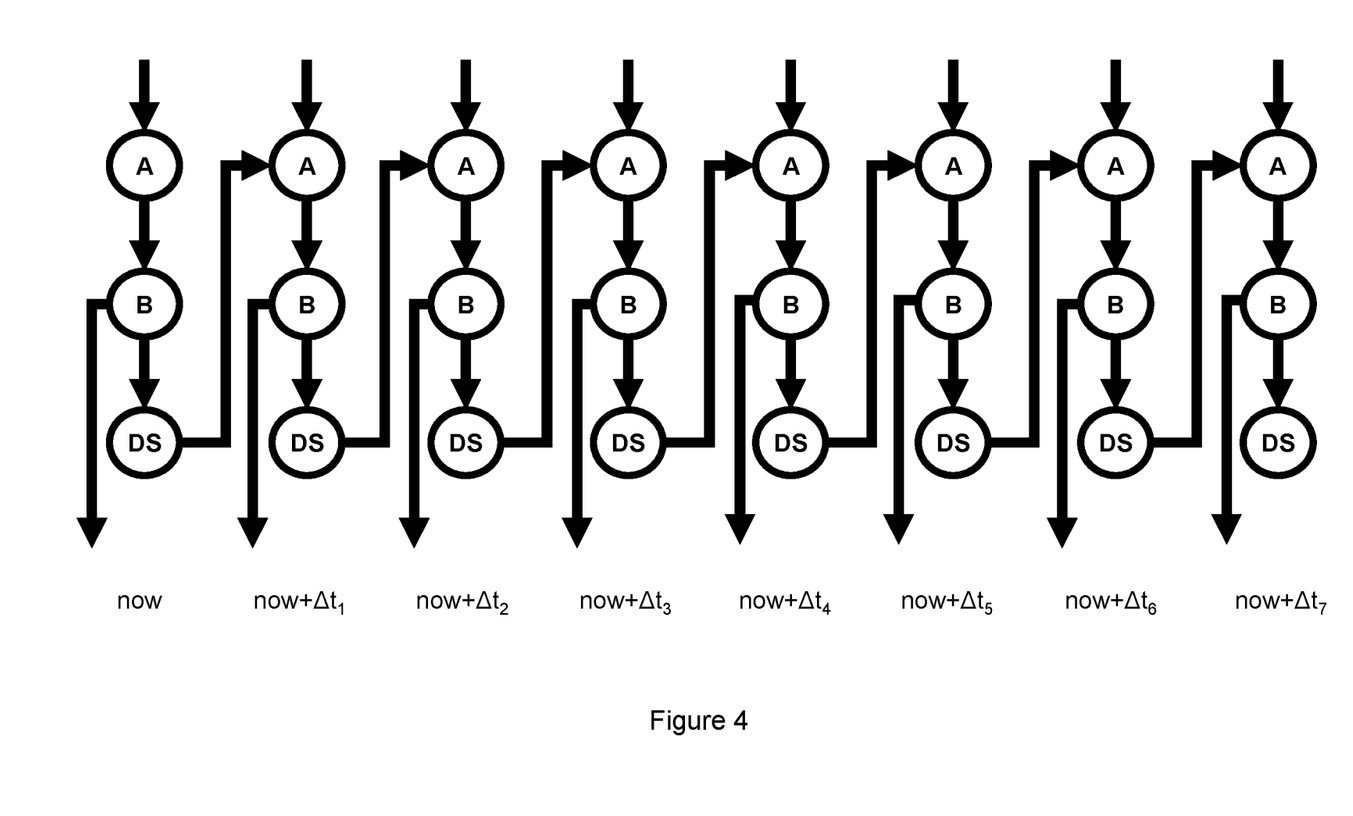
FIG. 4 is a schematic representation of a source digital twin and seven clone digital twins.

Cloning digital twins may increase the computational load and resource consumption in direct proportion to the number of clones (see below for more strategies to mitigate this possible effect). Note that each clone is responsible for its range of time, maintaining a constant offset from the base simulation, which is set by the data stream synthesizer. As real time progresses the sDT follows and the cDTs maintain their offset (e.g. $\Delta t_1$ and $\Delta t_2$ in FIG. 3). However, as this is simulation of the evolution of a real system, the further into the future, the lower the accuracy of the clones as simulation errors propagate to the next stage, from modelling inaccuracies and lack of current values for some data. Furthermore, the further forward in time predicted, the longer the timescale that values are required for. For both these reasons the range of time that each clone is responsible for will not necessarily be constant and can increase the further ahead of time modelled. See FIG. 4 for an illustration of this. In FIG. 4, each digital twin is shown comprising exemplary nodes A and B and followed by a data stream synthesizer DS. The first digital twin to the left of the figure is a source digital twin, whereas the other digital twins are clones, and $\Delta t$ can increase from $\Delta t_1$ to $\Delta t_7$.

As the current time progresses the "now" source digital twin uses incoming data to keep up to date with the current time. The output from "now" driving "now+$\Delta t_1$" and "now+$\Delta t_2$" via the data stream synthesizers means that these clones maintain their offset from the current time. In this way, services that rely on simple evolution of the current state (e.g. routing based on traffic conditions one hour into a journey) can be delivered.

Figure 5:
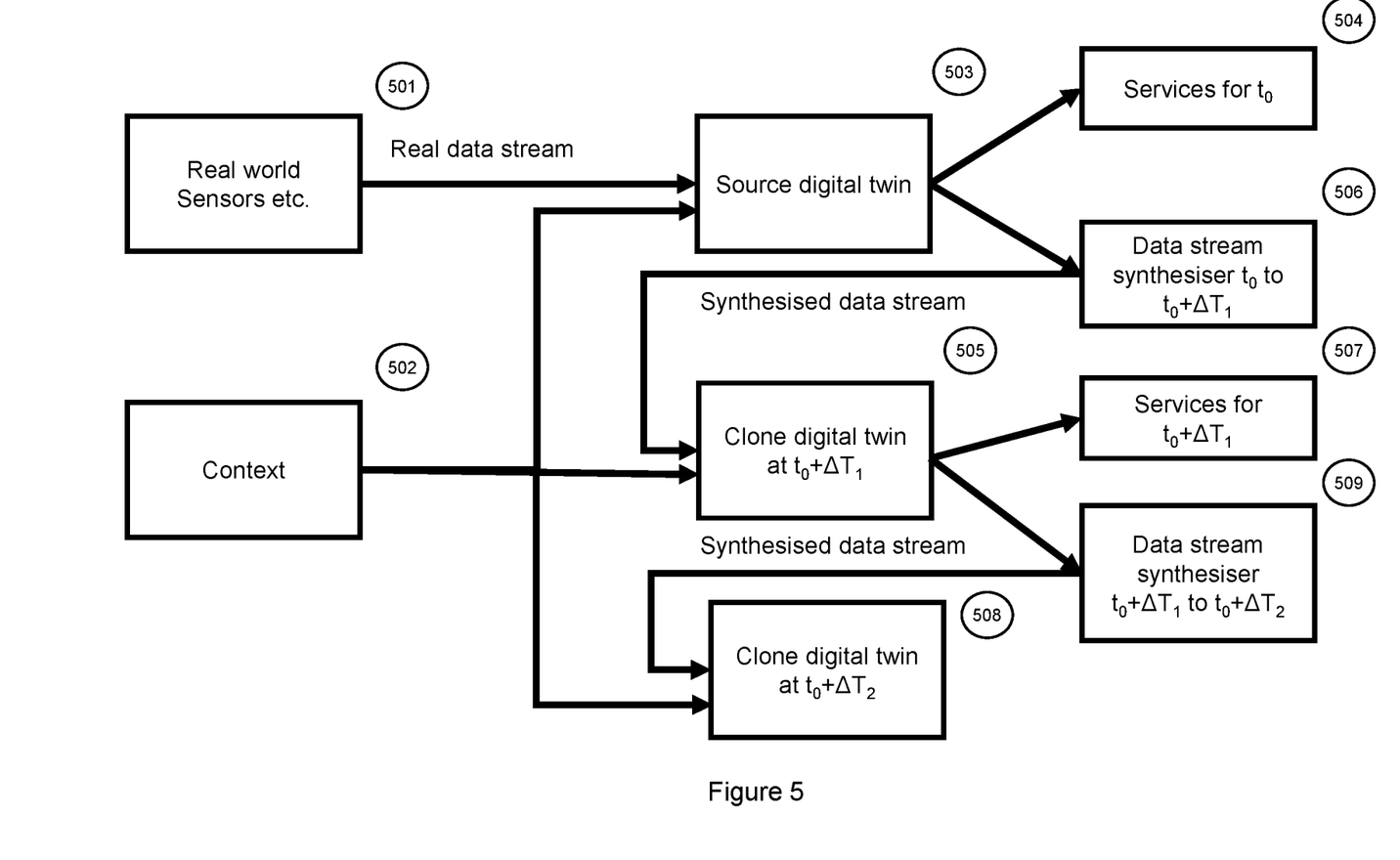
FIG. 5 is a schematic representation of a digital twin sequence.

FIG. 5 is a schematic diagram in which representation of the individual nodes (object digital twins) in each system digital twin have been replaced with a single block representing the system digital twin. It shows the major processes in an implementation of a digital twin Sequence DTS.

A digital twin system as known from the prior art, which maintains an evolving mirror of the state of a Physical System is formed from items 501, 502, 503 and 504. Real world sensors 501 and/or other real-world data sources provide a real data stream which is fed to a source digital twin sDT (of the system) 503. The output of the source digital twin (sDT) is passed to both services 504 and a data stream synthesizer 506. The sDT 503 modelling the Physical System is not only driven by a real-time data stream 501 but, possibly also by a stream of further data 502 providing information about the context of the Physical System (for example, weather conditions, events, time of year etc.), which may be real time or from, for example, database queries. The system delivers services 504 (such as simple routing services) to clients using data from the sDT. The next component of the DTS is formed by cloning the sDT 503 to form the first cDT 505, which is driven by a synthesised data stream created from the data stream synthesizer 506 and possibly from context information (offset by $\Delta T_1$, for example by consulting a later weather forecast or data applicable to the incremented time, if there is a change in the context data over time). This cDT provides services 507 for clients derived from data that estimate the state of the Physical System at $t_0+\Delta T_1$. The DTs is extended further into the future by cloning the first cDT to form a cDT 508 at $t_0+\Delta T_2$ (which is driven by a synthesised data stream 509 and possibly context data offset by $\Delta T_2$). Thus, the second cDT 508 has a state which is the same as the first clone and is then adjusted for $\Delta T_2$.

Clones can be constructed in one of two ways:
  Through full replication. Each clone operates as an independent entity maintaining copies of its dynamic and static states. This has the advantage of simplicity in coding and allows for changes to the configuration during time (for example, addition and/or deletion of processing nodes representing individual objects)
  Clones can be created as additional processing/services within the base digital twin. This has additional coding complexity as incoming data must be handled by the correct time-advanced instance and dynamic state must be isolated. This technique does have the potential to be more resource efficient since static state can be shared amongst all the instances (clones).

Most streaming systems have a mechanism for retaining non-volatile state—in case of computer failure or, for some platforms, to facilitate upgrades. State restoration is designed to be efficient. Cloning to create a new sequence may be started by copying the saved state of the sDT to initialise the first cDT. The output from this can be used to initialise the next clone in the time sequence and so on.

Figure 6:
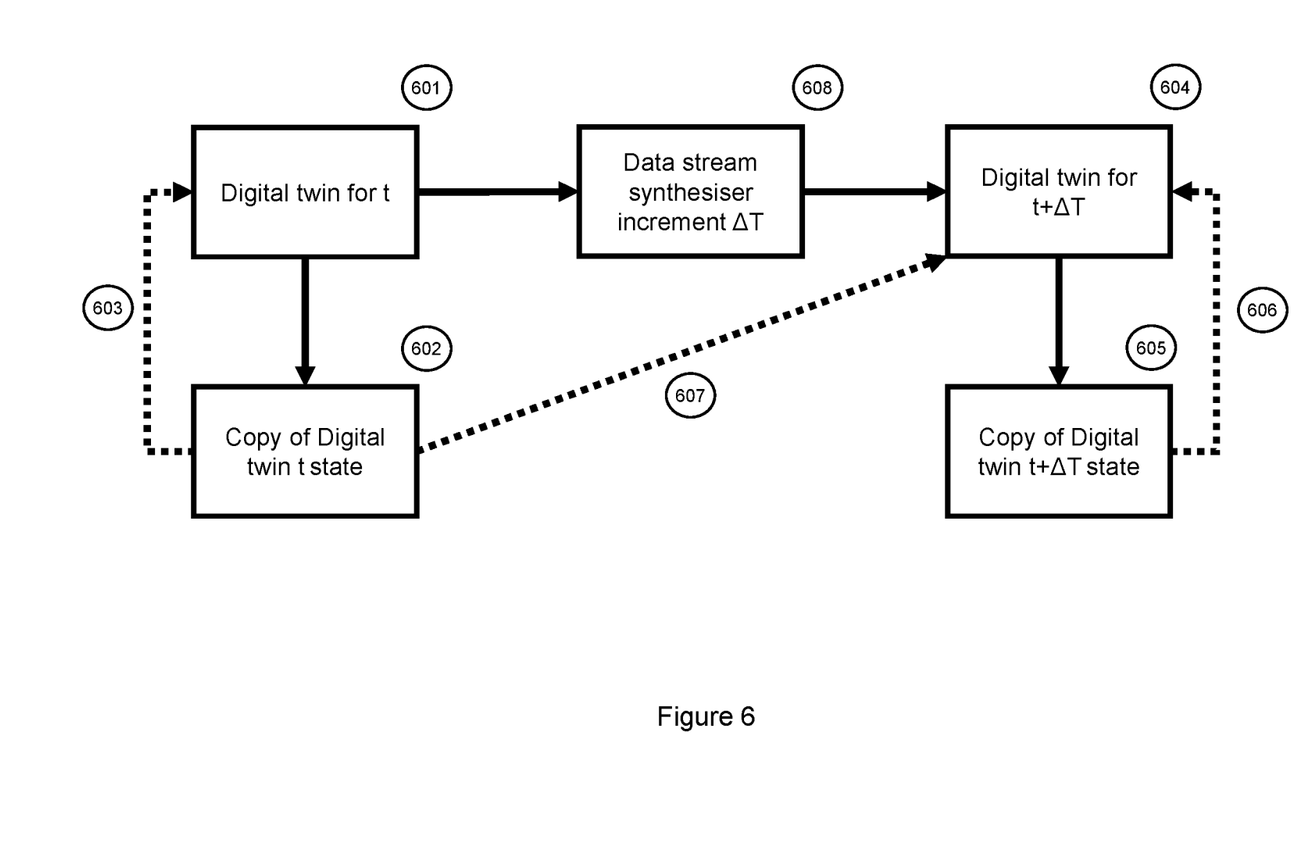
FIG. 6 is a schematic representation of cloning a digital twin.

FIG. 6 illustrates this process. 601 is a DT as part of the DTS. As part of good administrative practise, the continuous execution of the computer program executing the DT is ensured by taking regular copies of the state of the program and saving them on some form of non-volatile storage. In the case of systems such as Dracena the program state consists of all of the state values of every object in the DT and the computer code that is being used to model the system (602). In the case of a failure, the execution of the DT can be resumed by restoring the saved state to the execution hardware (603). The same mechanism is available to every DT in the sequences (604, 605, 606).

To extend a DT sequence by $\Delta T$, execution capability (hardware and supporting software e.g. Flink) is allocated for the new clone. Execution of the new clone is started by restoring the saved copy of the state at t to the newly allocated hardware and software (607) which initialises both the computation and the object states of the DT at t+$\Delta T$ (604) to that of 603, i.e. at time t. In parallel to the initialisation of 604, a new Data Stream Synthesiser (608) is created and attached to the output of 603. This allows the data stream to move the clone at 604 from time t to time t+$\Delta T$ as required.

Note that the program state save and restore mechanism is possible using a variety of technologies.

Figure 7:
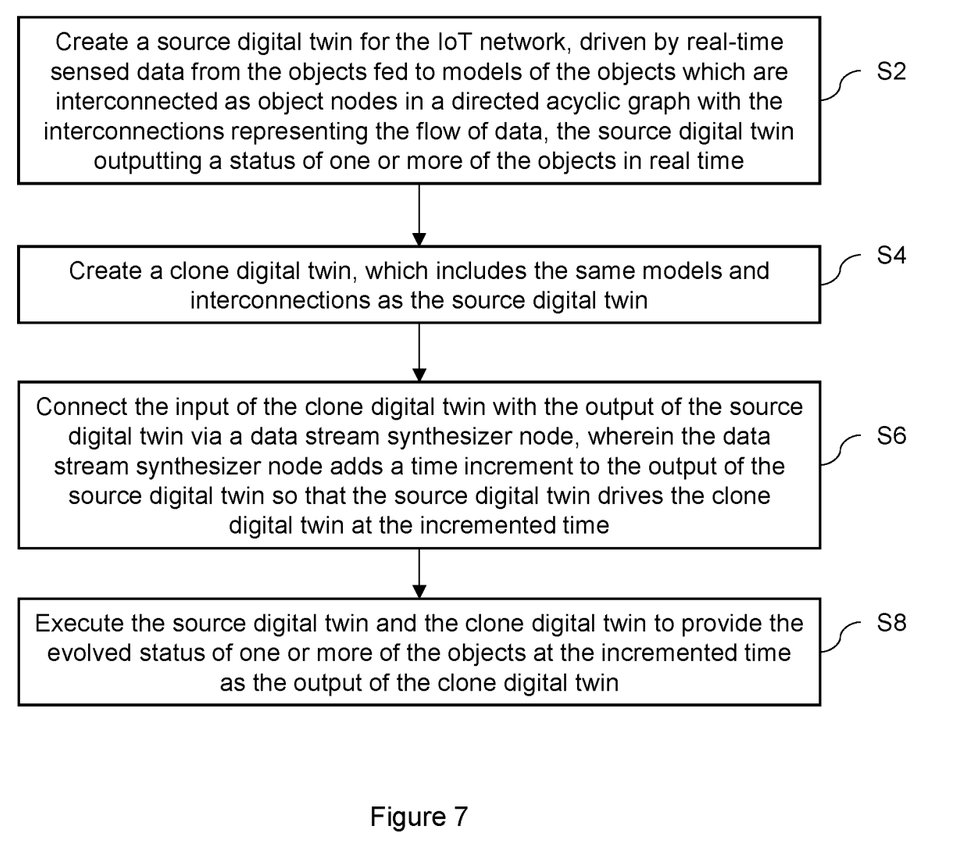
FIG. 7 is a flow diagram illustrating a method of predicting the evolution of simulation results for an IoT network.

FIG. 7 is a flow diagram of a method of predicting the evolution of simulation results for an Internet of Things, IoT, network according to a general embodiment. Step S2 creates a source digital twin (sDT) for the IoT network. The sDT is driven by real-time sensed data from objects fed to models of the objects, which are interconnected as object nodes in a DAG. In the DAG, interconnections represent the flow of data. The sDT outputs the state of one or more of the objects in real time.

A clone digital twin (cDT) is created in step S4 and includes the same models and interconnections of the sDT.

Step S6 comprises connecting the input of the cDT with the output of the sDT via a data steam synthesizer (DS) node. The DS adds a time increment to the sDT output so the sDT drives the cDT at the incremented time.

Finally, at step S8, both the sDT and cDT execute to provide the evolved state of one or more of the objects at the incremented time as the output of the cDT.

EXAMPLES

Public Transport:

The management of bus (and train and tram and water vehicle) public transport networks is currently rigid, with buses operating on fixed routes and to fixed timetables. Variations in actual conditions—traffic, speed of embarkation and disembarkation—mean that the delivered service can be irregular and vehicles across the system can vary from empty to over full. Some public transport authorities can dynamically manage some aspects, for example by adjusting the spacing between buses in real time. A better level of service can be delivered by full dynamic allocation of resources and anticipating problems with services before they occur.

A DTS as described here forms the basis of a dynamic bus management system, providing a source of truth about the current state of the buses and the quality of service delivered. Buses are equipped with systems that report their state in real time, such as position, speed etc. These data are combined with other sources of data such as road traffic conditions. The same scenario applies to tram, rail, ferry and other public transport networks.

The sDT and all cDTs contain the following individual twin types (or nodes such as A, B and C in FIGS. 1 and 2):

Incident: These nodes mirror things that can happen to the wider environment that may have an impact on the delivery of the bus service. One type of Incident is the blockage of a part of a road, for reasons such as a traffic accident, road works or utility problems. A blocked road Incident notification is generated by the real management application and location of the blocked region and an expected time to clear. Another type of Incident may be a constriction in part of the road, due to the same problems. Or, an Incident could be the ending of an event (concert) that mean a lot of people are trying to get home at the same time from the same bus stop.

Events from the real world trigger the Incidents to become active. Incidents become inactive in the sDT when notified by the real management application and in the cDTs when the expected clear time is passed or by a cascaded clear notification.

Incidents notify possibly affected Stops of changes to their state (such as the start, end, and location of the Incident).

In order to minimise the number of messages passed between Incidents and Stops, Stops have a bounding box computed. Stop path locations are converted to coordinates and the maximal and minimal values of these computed to form a bounding box and transmitted to Incidents when an Incident is started. The use of eastings and northing for this purpose is known (see <URL: https://en.wikipedia.org/wiki/Easting_and_northing>), although of course any coordinate system will be sufficient, such as latitude and longitude. The bounding boxes can overlap, particularly if the stop paths are winding. Incidents communicate their state change only to those Stops whose bounding box contains the Incident.

Stop: A Stop represents a bus stop and part of the road network that connects the Stop to the following Stop on the route. A Stop maintains a view of the state of the real road network that it represents; in particular if it is blocked. A Stop also maintains a view of the Runs that use the Stop and, when an Incident that affects the Stop (that is, is within its bounding box), informs the Runs of the Incident.

Run: Bus routes have several Runs, the actual track that a bus is timetabled to follow. Runs can be different directions of a route. The Run twin object maintains the actual paths that buses on the Run should follow and updates buses on the Run with any changes. Input data arrives from the appropriate Data Stream (501 or 506, 509) to notify the start of a real bus on a run and the exit of the bus (data is a Bus identifier which is initially generated by the—real—bus). Changes to a Run are received from Stop twins. These changes are a Stop name, ending Stop name and directions that buses must follow (GPS locations and instructions) to reach the Ending Stop. The Run twin distributes these changes to Bus twins registered as being on the Run. The Run twin also receives notifications of changes to Incidents (as a location) and generates rerouting requests so that buses route appropriately around the Incident.

Bus: twin of a vehicle on the road driving over a Run. This twin receives location (metres, easting and northing) and speed data (metres/second) from the appropriate Data Stream (501 or 506, 509). The twin also maintains the current path (a route, such as those created by route finding applications, a list of directions and stops that the driver must follow) of the bus. The path can be dynamically updated by other twins in the sDT or cDT like the Run twin in response to Incidents. The reported locations are matched to the current path to ensure that the driver is following the correct route. Changes to the path are transmitted, using interfaces to the Kafka messaging service in Dracena, to the real bus to enable dynamic routing.

The digital twins in the DTS are linked by the data flows:

Path: as bus Paths change in response to rerouting due to Incidents, generated in the cDT, they are communicated to CDTs later in the chain, without modification by a Data Stream Synthesiser. Planned Incidents, such as road works, can be inserted into cDTs or into the sDT.

Bus position: each bus DT holds the instantaneous value for the position of a Bus at the (simulation) time of the DT. The Data Stream Synthesiser advances this position by the time increment for the subsequent cDT using a speed, dependant on traffic conditions transmitted via a Context source, and the current Path of the bus (received from the previous DT).

Incident development: State changes pass along the DTS, the state of an Incident within a cDT depends on the simulation time of the cDT The structure of the DTS built from the sDT and cDTs described above depends on the requirements of the operators and the anticipated accuracy of predictions embedded in the chain (this accuracy will depend on the accuracy of input data, such as passenger and traffic forecasts). The time increment between cDTs is related to the variability of these external data sources, typically the spacing would be 5 minutes with 3 cDTs executing concurrently.

Figure 8:
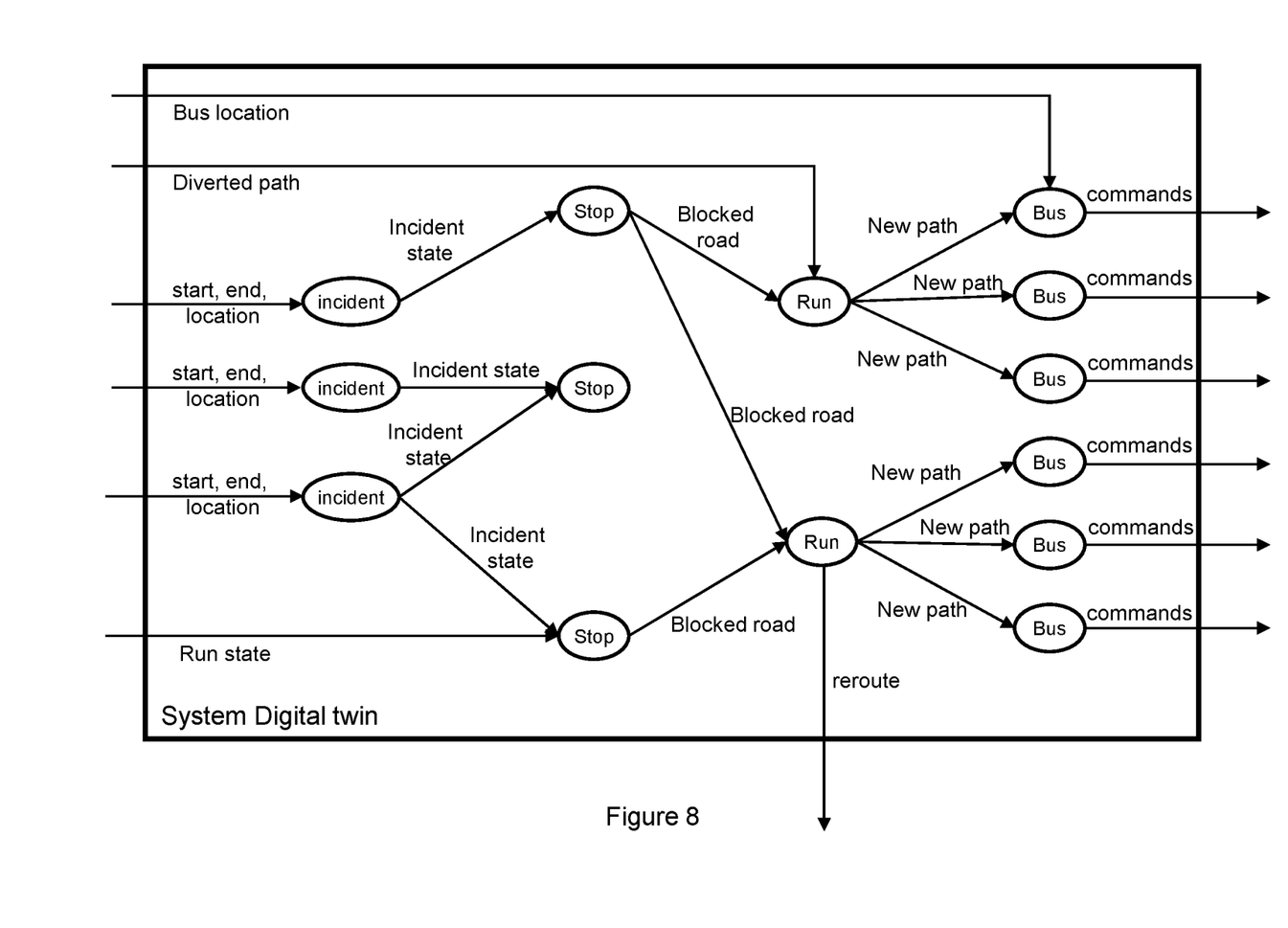
FIG. 8 is a diagram of a public transport example.
Figure 9:
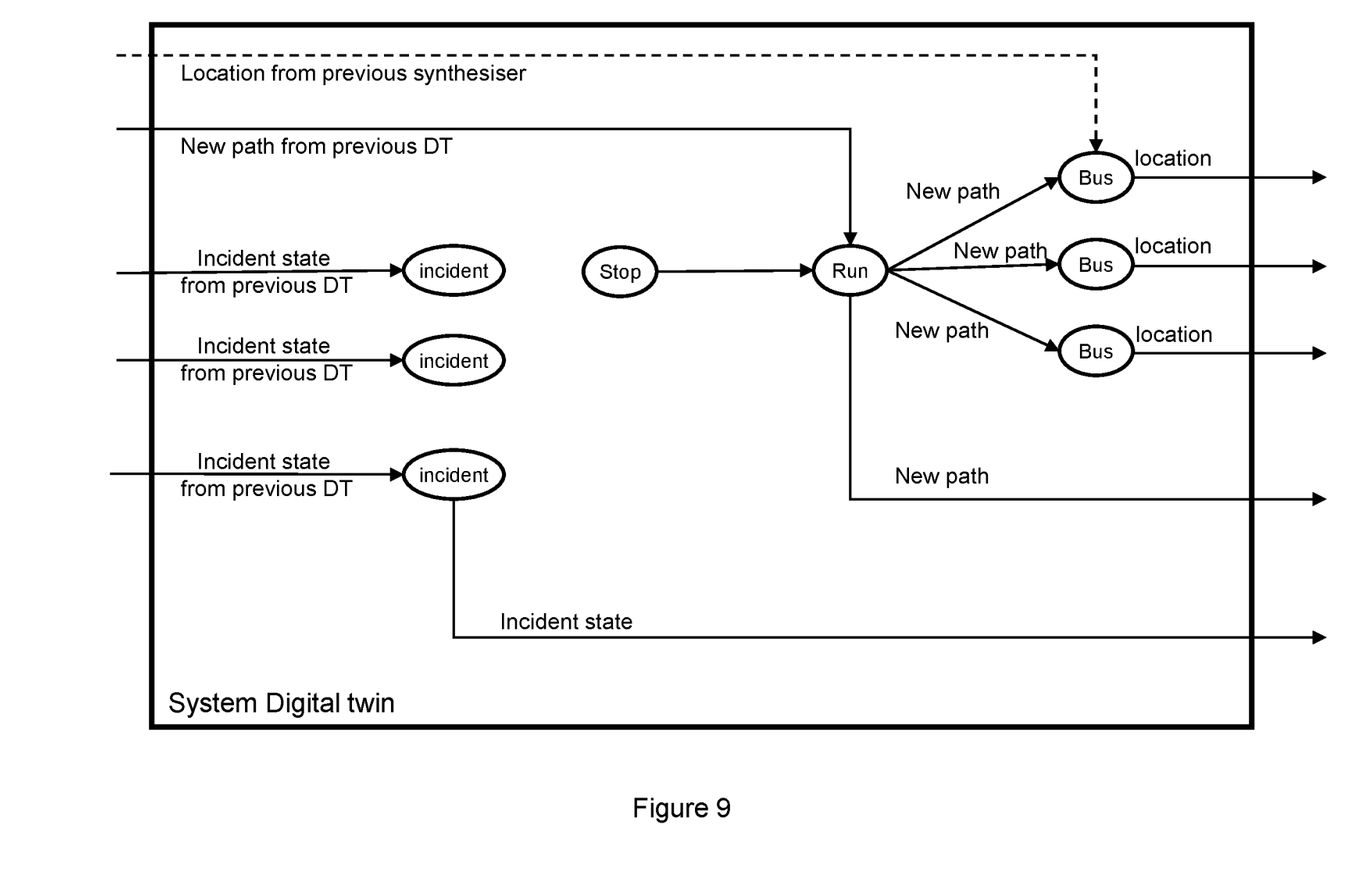
FIG. 9 is a diagram of a public transport example with connected digital twins.

FIGS. 8 and 9 show a simplified structure for this system. FIG. 8 shows a number of instantiations of the object types described above and a few of the data flows. Note that the message flow is directional, and the connections form a DAG with no cycles. The order of the nodes is "Incident", "Stop", "Run", "Bus". Three Incidents affect three different stops. There are blocked roads on two of the stops and this leads to re-routing on two runs, with three buses on each of the two runs following new paths.

FIG. 9 shows the additional flow required to connect DTs into a sequence (the data flows from FIG. 8 are still in place, but not all are shown). Here, the clone receives location from the previous synthesizer, a new path from a previous DT (source or clone), and Incident states from the previous DT. Hence, the effect of the modelling can be a predicted change in routing of a public transport vehicle. This may have the further result of providing a warning, for example to a system operator or user, using a display on a GUI (or app) or even just an audible warning.

Traffic Management for Highways:

A further example of the application of this proposal is in the area of traffic management for highway systems. Ensuring good flow of traffic is important for the experience of drivers, the reliability of deliveries travelling on the network, and to increase capacity. To this end, the operators of highway systems have an extensive sensor system and acquire data from other sources such as vehicle location data from cell towers. Future developments in the Internet of Things and connected cars will increase the variety and volume of data sources. The operators have a number of management strategies to mitigate the effect of an incident on the network, such as imposing variable speed limits, diverting traffic, closing one or more lanes, and controlling joining traffic. Each of these options will have a different effect on the incident and the wider road network.

In this example there are no digital twins of individual vehicles, vehicle data is held and modelled as aggregations.

The source digital twin will twin the highways network, as a series of connected road segments, each segment having characteristics such as traffic density, traffic flow and traffic speed. Twins are also added for the data sources—road sensors and vehicle motion data and for the control mechanisms (sign values, junction traffic lights, lane closures).

Road Segment digital twins maintain a view of the state of the section of the road that they mirror. To model the state of traffic over the roads, this includes flow (vehicles per second) and density (vehicles per metre). Data Stream Synthesisers use the "fundamental equation" of traffic flow (see <URL: https://en.wikipedia.org/wiki/Traffic_flowj to estimate the time evolution using as input the state (flow, density) of connecting road segments.

The digital twin Sequence predicts the near-term future evolution of the network with the Data Stream Synthesisers modelling the movement of vehicles between segments and other drivers of highway performance (e.g. vehicles entering and leaving the network).

Services on the DTS allow detection of future problems. Once an incident occurs, the DTS will evolve to predict the impact of the incident and, if warranted, a decision can be made to take mitigating action, such as imposing variable speed limits.

Other Applications:

Other application areas include:
Smart cities managing the flow of people and goods through a city by monitoring conditions, dynamically allocating transport resources, and adjusting priorities (traffic lights). A DTS is used to look ahead to anticipate problems, such as congestion or irregular services.

Power networks ensuring a balanced supply of power across a wide area where the generation includes contributions from many distributed, small scale units (such as domestic solar panels and wind turbines). The time evolution of renewable generation is driven by external data sources (Context, 502—weather forecasts, day/night cycle). The state of the overall network is also determined by storage facilities, batteries, hydroelectric availability, etc., whose evolution is modelled by Data Stream Synthesisers.

SUMMARY

This methodology enhances the power and utility of digital twins of Smart IoT driven systems that are characterised as complex networks of dynamically interacting objects. It adds the ability to run these system digital twins forward in time in a simple and flexible manner using only the base digital twin (current methods require the creation of a completely separate model to add a predictive capability). As a result, system digital twins can be used to make predictions of the impact of events and the consequences of mitigating actions.

The enhanced digital twins enable proactive active management of their physical systems, resulting in, for example, more efficient and less polluting transport networks.

There are many benefits of the described arrangements for source and clone digital twins, including:
Insights into the future evolution of the modelled system;
Implementation of these ideas will move digital twins of networked systems from current state reporting and analysis tools to true management tools with prediction of future states and consequences;
Real time digital twin modelling of large networked systems for better smart transport, cities, and energy.

These techniques can be used to create a model of the future states of a system by cloning the current state model, and to drive the clone's evolution by replacing real data streams by synthesised data streams.

Figure 10:
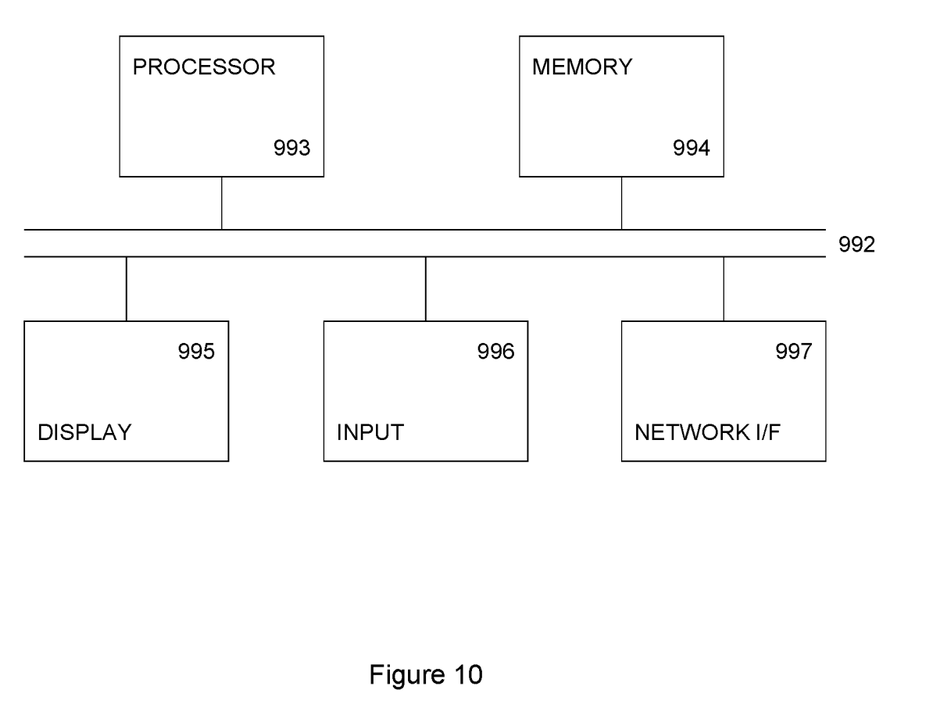
FIG. 10 is a diagram of suitable hardware for implementation of invention embodiments.

FIG. 10 is a block diagram of a computing device, such as a data storage server, which embodies the present invention, and which may be used to implement a method of modelling using a source DT and one or more clone DTs. The computing device comprises a processor 993, and memory, 994. Optionally, the computing device also includes a network interface 997 for communication with other computing devices, for example with other computing devices of invention embodiments. The computing device may implement one of the platforms mentioned earlier, such as Dracena.

For example, an embodiment may be composed of a network of such computing devices. Optionally, the computing device also includes one or more input mechanisms such as keyboard and mouse 996, and a display unit such as one or more monitors 995. The components are connectable to one another via a bus 992.

The memory 994 may include a computer readable medium, a term which may refer to a single medium or multiple medium (e.g., a centralized or distributed database and/or associated caches and servers) configured to carry computer-executable instructions or have data structures stored thereon. Computer-executable instructions may include, for example, instructions and data accessible by and causing a general-purpose computer, special purpose computer, or special purpose processing device (e.g., one or more processors) to perform one or more functions or operations. Thus, the term "computer-readable storage medium" may also include any medium that is capable of storing, encoding or carrying a set of instructions for execution by the machine and that cause the machine to perform any one or more of the methods of the present disclosure.

The term "computer-readable storage medium" may accordingly be taken to include, but not be limited to, solid-state memories, optical media and magnetic media. By way of example, and not limitation, such computer-readable media may include non-transitory computer-readable storage media, including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices).

The processor 993 is configured to control the computing device and execute processing operations, for example executing code stored in the memory to implement the various different functions described here and in the claims. For example, the processor may carry out the steps execute the models of the digital twins. Additionally or alternatively, the processor may carry out steps that create the digital twins, or add incidents, such as those described in the examples.

The memory 994 stores data being read and written by the processor 993, for example it may include any database referred to herein, or it may simply store parameters for the models such as positions and speeds of objects being modelled. As referred to herein, a processor may include one or more general-purpose processing devices such as a microprocessor, central processing unit, or the like. The processor may include a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor may also include one or more special-purpose processing devices such as an application specific integrated circuit (ASIC), a field programmable gate array (FPGA), a digital signal processor (DSP), network processor, or the like. In one or more embodiments, a processor is configured to execute instructions for performing the operations and steps discussed herein.

The display unit 995 may display a representation of data stored by the computing device and may also display a cursor and dialog boxes and screens enabling interaction between a user and the programs and data stored on the computing device. The input mechanisms 996 may enable a user to input data and instructions to the computing device. In one example the display may be used to show a representation of the DTS (for example in graph form), or of the individual twins (for example as tables of states and/or as inputs and outputs). In another example, the display may show a vehicle alert generated, such as a warning of an imminent collision or of traffic, or of a bus delay.

The network interface (network I/F) 997 may be connected to a network, such as the Internet, and is connectable to other such computing devices via the network, enabling the computing device to access databases as necessary and retrieve real-time data for constructing/updating the digital twins. The network I/F 997 may control data input/output from/to other apparatus via the network. Other peripheral devices such as microphone, speakers, printer, power supply unit, fan, case, etc. may be included in the computing device.

Methods embodying the present invention may be carried out on a computing device such as that illustrated in FIG. 10. Such a computing device need not have every component illustrated in FIG. 10 and may be composed of a subset of those components. A method embodying the present invention may be carried out by a single computing device in communication with one or more data storage servers via a network. The computing device may be a data storage itself storing modelling data.

A method embodying the present invention may be carried out by a plurality of computing devices and/or IoT objects operating in cooperation with one another. One or more of the pluralities of computing devices may be a data storage server storing at least a portion of the modelling data for the digital twins.

The invention claimed is:

1. A method of predicting evolution of simulation results for an Internet of Things (IoT) network, comprising:
    creating a source digital twin for the IoT network, driven by real-time sensed data from objects in the IoT network fed to models of the objects interconnected as object nodes in a directed acyclic graph (DAG) with interconnections representing flow of data, the source digital twin to output a state of at least one object of the objects in the IoT network in real time;
    creating a clone digital twin, which includes same models and interconnections as the source digital twin;
    connecting an input of the clone digital twin with an output of the source digital twin via a data stream synthesizer node,
        wherein the data stream synthesizer node adds a time increment to the output of the source digital twin so that the source digital twin drives the clone digital twin at the incremented time;
    executing the source digital twin and the clone digital twin to indicate an evolved state of at least one object of the objects in the IoT network at the incremented time as an output of the clone digital twin; and
    creating a service node as part of the DAG at the output of the source digital twin and/or the clone digital twin, the service node producing a data service based on the evolved state of the at least one object of the objects in the IoT network.

2. The method according to claim 1, wherein the source digital twin, the clone digital twin and the data stream synthesizer node together form the DAG.

3. The method according to claim 1, wherein object nodes in the source digital twin include event nodes of modeled events which affect the IoT network.

4. The method according to claim 3, wherein the modeled events include incidents which have an impact on the state of the at least one of the objects in the IoT network.

5. The method according to claim 1, wherein the object nodes for the source digital twin include system information nodes modelling information about the IoT network.

6. The method according to claim 1, wherein the service node is provided in parallel with the data stream synthesizer node at the source digital twin, and further comprising feeding same output of the source digital twin to the service node and the data stream synthesizer node.

7. The method according to claim 1, further comprising:
    creating a further clone digital twin, which includes same models and interconnections as the source digital twin and the clone digital twin;
    connecting an input of the further clone digital twin with the output of the clone digital twin via an additional data stream synthesizer node, wherein the additional data stream synthesizer node adds a further time increment to the output of the clone digital twin so that the clone digital twin drives the further clone digital twin at the further incremented time; and
    executing the source digital twin, the clone digital twin and the further clone digital twin, to provide data at an output of the further clone digital twin indicating a further evolved state of at least one object of the objects in the IoT network at the further incremented time.

8. The method according to claim 7, wherein the further time increment has a different value, preferably a larger value, than the time increment.

9. The method according to claim 7, wherein context information from an external data source is additionally input into at least one digital twin selected from among the source digital twin, the clone digital twin, and the further clone digital twin.

10. The method according to claim 1, wherein the IoT network is a traffic network, and the object nodes include vehicle nodes and/or at least one infrastructure node, and at least one event node.

11. The method according to claim 10 wherein an event node among the at least one event node includes a traffic incident node.

12. The method according to claim 1, wherein the state of the at least one object of the objects includes at least one state selected from among a position of the at least one object and a speed of the at least one object.

13. The method according to claim 10, wherein the traffic network is a public transport network infrastructure, and the object nodes for the source digital twin and for the clone digital twin include the vehicle nodes, incident nodes representing events indicated to have an effect on the public transport network, stop nodes representing a section of the public transport network infrastructure, and system information nodes representing a path of a vehicle represented by a vehicle node among the vehicle nodes.

14. A non-transitory computer-readable medium for predicting evolution of simulation results for an Internet of Things (IoT) network, comprising instructions stored thereon which, when executed by a processor, cause the processor to carry out:

creating a source digital twin for the IoT network, driven by real-time sensed data from objects in the IoT network fed to models of the objects interconnected as object nodes in a directed acyclic graph (DAG) with interconnections representing flow of data, the source digital twin to output a state of at least one object of the objects in the IoT network in real time;

creating a clone digital twin, which includes same models and interconnections as the source digital twin;

connecting an input of the clone digital twin with an output of the source digital twin via a data stream synthesizer node, wherein the data stream synthesizer node adds a time increment to the output of the source digital twin so that the source digital twin drives the clone digital twin at the incremented time;

executing the source digital twin and the clone digital twin to indicate an evolved state of at least one object of the objects in the IoT network at the incremented time as an output of the clone digital twin; and creating a service node as part of the DAG at the output of the source digital twin and/or the clone digital twin, the service node producing a data service based on the evolved state of the at least one object of the objects in the IoT network.

15. A computer to predict evolution of simulation results for an Internet of Things (IoT) network, comprising:

a processor; a memory; and a network interface, the computer configured to carry out:

creating a source digital twin for the IoT network, driven by real-time sensed data from objects in the IoT network fed to models of the objects interconnected as object nodes in a directed acyclic graph (DAG) with interconnections representing flow of data, the source digital twin to output a state of at least one object of the objects in the IoT network in real time;

creating a clone digital twin, which includes same models and interconnections as the source digital twin;

connecting an input of the clone digital twin with an output of the source digital twin via a data stream synthesizer node, wherein the data stream synthesizer node adds a time increment to the output of the source digital twin so that the source digital twin drives the clone digital twin at the incremented time; and executing the source digital twin and the clone digital twin to indicate an evolved state of at least one object of the objects in the IoT network at the incremented time as an output of the clone digital twin; and creating a service node as part of the DAG at the output of the source digital twin and/or the clone digital twin, the service node producing a data service based on the evolved state of the at least one object of the objects in the IoT network.

* * * * *